United States Patent
Micheloni et al.

(10) Patent No.: US 6,871,258 B2
(45) Date of Patent: Mar. 22, 2005

(54) METHOD FOR ERASING AN ELECTRICALLY ERASABLE NONVOLATILE MEMORY DEVICE, IN PARTICULAR AN EEPROM-FLASH MEMORY DEVICE, AND AN ELECTRICALLY ERASABLE NONVOLATILE MEMORY DEVICE, IN PARTICULAR AN EEPROM-FLASH MEMORY DEVICE

(75) Inventors: Rino Micheloni, Turate (IT); Giovanni Campardo, Bergamo (IT); Salvatrice Scommegna, Sulbiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/159,780

(22) Filed: May 30, 2002

(65) Prior Publication Data

US 2003/0028709 A1 Feb. 6, 2003

(30) Foreign Application Priority Data

Jun. 5, 2001 (EP) .............................................. 01830369

(51) Int. Cl.[7] .............................................. G06F 12/00
(52) U.S. Cl. .................................. 711/103; 365/185.33
(58) Field of Search ...................... 711/103; 365/185.29, 365/185.33

(56) References Cited

U.S. PATENT DOCUMENTS

| | | | | |
|---|---|---|---|---|
| 5,267,209 A | * | 11/1993 | Yoshida ................. | 365/185.27 |
| 5,297,096 A | * | 3/1994 | Terada et al. .......... | 365/185.11 |
| 5,596,530 A | * | 1/1997 | Lin et al. ................. | 365/185.3 |
| 5,633,823 A | * | 5/1997 | Lee ........................ | 365/185.29 |
| 5,841,721 A | * | 11/1998 | Kwon et al. ................. | 365/218 |
| 5,963,477 A | * | 10/1999 | Hung .................... | 365/185.22 |
| 6,122,200 A | | 9/2000 | Campardo et al. | |
| 6,307,784 B1 | * | 10/2001 | Hamilton et al. ...... | 365/185.22 |
| 6,356,481 B1 | | 3/2002 | Micheloni et al. | |
| 6,452,836 B1 | * | 9/2002 | Roohparvar .......... | 365/185.22 |
| 6,490,202 B2 | * | 12/2002 | Roohparvar .......... | 365/185.22 |

FOREIGN PATENT DOCUMENTS

| | | |
|---|---|---|
| EP | 0 920 023 A1 | 6/1999 |
| EP | 1 061 525 A1 | 12/2000 |

* cited by examiner

*Primary Examiner*—Matthew D. Anderson
(74) *Attorney, Agent, or Firm*—Lisa K. Jorgenson; Dennis M. de Guzman; Seed IP Law Group PLLC (57) ABSTRACT

Described herein is an erase method for an electrically erasable nonvolatile memory device, in particular an EEPROM-FLASH nonvolatile memory device, comprising a memory array formed by a plurality of memory cells arranged in rows and columns and grouped in sectors each formed by a plurality of subsectors, which are in turn formed by one or more rows. Erase of the memory array is performed by sectors and for each sector envisages applying an erase pulse to the gate terminals of all the memory cells of the sector, verifying erase of the memory cells of each subsector, and applying a further erase pulse to the gate terminals of the memory cells of only the subsectors that are not completely erased.

25 Claims, 9 Drawing Sheets

| SUBSECTOR<0> | : 1 ROW * 2048 COLUMNS |
|---|---|
| SUBSECTOR<1> | : 1 ROW * 2048 COLUMNS |
| SUBSECTOR<2> | : 1 ROW * 2048 COLUMNS |
| ⋮ | |
| SUBSECTOR<510> | : 1 ROW * 2048 COLUMNS |
| SUBSECTOR<511> | : 1 ROW * 2048 COLUMNS |

| SUBSECTOR<0> | : 1st ROW * 2048 COLUMNS |
|---|---|
| SUBSECTOR<0> | : 2nd ROW * 2048 COLUMNS |
| SUBSECTOR<1> | : 1st ROW * 2048 COLUMNS |
| SUBSECTOR<1> | : 2nd ROW * 2048 COLUMNS |
| ⋮ | |
| SUBSECTOR<255> | : 1st ROW * 2048 COLUMNS |
| SUBSECTOR<255> | : 2nd ROW * 2048 COLUMNS |

METHOD FOR ERASING AN ELECTRICALLY ERASABLE NONVOLATILE MEMORY DEVICE, IN PARTICULAR AN EEPROM-FLASH MEMORY DEVICE, AND AN ELECTRICALLY ERASABLE NONVOLATILE MEMORY DEVICE, IN PARTICULAR AN EEPROM-FLASH MEMORY DEVICE

BACKGROUND OF THE INVENTION

1. Field of the Invention

The present invention relates to a method for erasing an electrically erasable nonvolatile memory device, and more in particular to a method for erasing an EEPROM-FLASH nonvolatile memory device.

The present invention moreover relates to an electrically erasable nonvolatile memory device, and more in particular to an EEPROM-FLASH nonvolatile memory device.

2. Description of the Related Art

As is known, nonvolatile memories comprise a memory array formed by memory cells arranged in rows and columns, in which word lines connect the gate terminals of the memory cells arranged on the same row, and bit lines connect the drain terminals of the memory cells arranged on the same column. Individual lines of the memory array are then addressed by means of a row decoder receiving an encoded address at input.

It is also known that in a floating-gate nonvolatile memory cell, storage of a logic state is performed by programming the threshold voltage of the memory cell itself through the definition of the amount of electrical charge stored in the floating-gate region.

According to the information stored, memory cells are distinguished into erased memory cells (logic state stored "1"), in the floating-gate region of which no electrical charge is stored, and written or programmed memory cells (logic state stored "0"), in the floating-gate regions of which an electrical charge is stored which is sufficient to cause a sensible increase in the threshold voltage of the memory cells themselves.

In nonvolatile memories, moreover, the memory array is generally divided into sectors, each of which is formed by a group of memory cells on which it is possible to perform the same operation simultaneously, generally an erase operation. In particular, in nonvolatile memories organized according to sectors it is possible to carry out reading and programming of individual memory cells of a sector and simultaneous erasing of all the memory cells of the sector, the latter operation being rendered possible by the fact that the memory cells belonging to the same sector have source terminals connected together.

In the panorama of nonvolatile memories, EEPROM memories are the ones that afford maximum flexibility of use in so far as they enable programming or erasing to be performed at the level of the individual byte, thanks to the fact that the memory cell is integrated with a selection transistor. The selection transistor is, however, cumbersome and, in practice, prevents this type of memories from reaching a storage capacity of the order of megabits.

For larger storage capacities the market has thus witnessed a considerable spread of EEPROM-FLASH memories, in which programming can again be performed at the level of the individual byte, but erasing can only be performed in blocks, the size range of which can be extremely wide, from 512 kbit to 1 Mbit, according to the needs of the user, and in any case cannot be lower than thousands of bits because otherwise the advantage, in terms of area, which distinguishes EEPROM-FLASH memories from EEPROM memories would be lost.

Within the family of EEPROM-FLASH memories, the two main architectures used are represented by the so-called NOR architecture and the so-called NAND architecture. In particular, the former architecture affords better performance than the latter in terms of reading speed, whilst the latter offers a better performance than the former in terms of erasing and programming speed.

The table below summarizes a comparison between the performance of EEPROM-FLASH memories with NOR architecture and the performance of EEPROM-FLASH memories with NAND architecture.

|  | NAND | NOR |
| --- | --- | --- |
| Programming | 0.4 µs/byte | 6 µs/byte |
| Erasing | 2 ms/sector | 0.8 ms/sector |
| Random reading | 10 µs | 130 ns |
| Sector | 128 kbit | 1 Mbit |

In particular, thanks to the short programming and erasing time, EEPROM-FLASH memories with a NAND architecture are particularly suited to meeting the requirements of portable applications, such as MP3 players and digital photocameras.

In order to compete also in these emerging market sectors, EEPROM-FLASH memories with NOR architecture are currently undergoing a revision of their traditional specifications; in particular, in-depth studies are in progress aimed at reducing the erase time.

As is known, erase of a nonvolatile memory is carried out by sectors and is a cumulative operation; i.e., it acts simultaneously and indistinctly on all the memory cells of the sector. Furthermore, it is a very complex operation in so far as it not only requires a number of preparative steps prior to erase proper, during which the electrical charges present in the floating-gate regions are extracted, and consequently the threshold voltage of the memory cells themselves is reduced, but also entails verifications and possible modifications subsequent to the erase proper in the event of the result of the erase not being fully satisfactory.

In particular, in order to erase a sector, first of all a pre-conditioning operation, also known as "program-all-0", is performed, whereby all the memory cells of the sector are brought to the programmed state irrespective of their current state. This is due to the fact that if a sector were to be erased where some of the memory cells are written but others are already erased, during the erase step there would occur over-erase of the memory cells already erased, and the said cells, with all likelihood, would become depleted memory cells, i.e., memory cells having a negative threshold voltage, and hence ones draining a current even when their gate terminals are set at ground voltage. These cells are particularly troublesome in so far as they simulate the constant presence of erased memory cells on the columns to which they belong, and consequently cause all the memory cells belonging to said columns to be read as erased irrespective of their actual state.

In order to prevent this phenomenon from occurring and in order to yield the history of all the memory cells belonging to the same sector uniform, the procedure is to write the entire sector.

Figure 1:
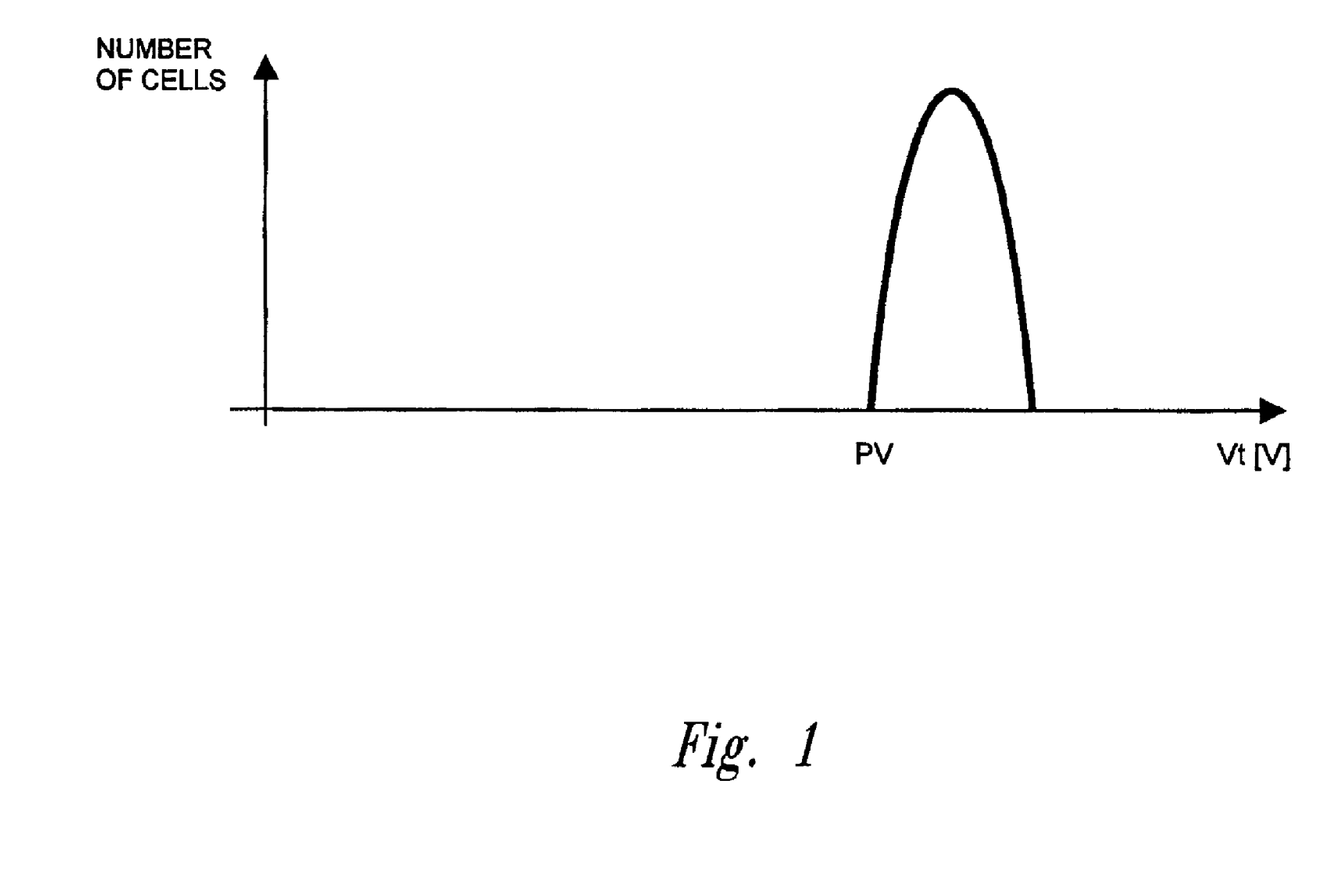
FIG. 1 shows the distribution of the threshold voltages of programmed nonvolatile memory cells.

Following upon the preconditioning operation, all the memory cells of the sector are hence found to be programmed and present threshold voltages having the distribution illustrated in FIG. 1 and identified with the binary information "0" associated thereto. For the said distribution, in FIG. 1 there is moreover indicated the minimum value PV typical of threshold voltages, which is typically 5 V.

Subsequently, the erase step proper is carried out, during which the electrical charges present in the floating-gate regions are extracted, and consequently the threshold voltage of the memory cells themselves is reduced.

To do this, between the source terminal and the gate terminal of each memory cell a high electrical field is applied, such as to enable the electrons to abandon the floating-gate regions thanks to the so-called Fowler-Nordheim tunnel effect.

Application of the electrical potentials necessary for extracting the electrical charges from the floating-gate regions may be done in various ways. One of the methodologies that can, for example, be used for extraction of electrical charges from the floating-gate regions is known in the literature as of "erase with negative gate" and basically envisages leaving the drain terminal of the memory cell that is to be erased floating and applying to the gate terminal a negative voltage pulse typically having an amplitude of 10 V and a time duration in the region of 10 ms, and applying to the source terminal and body terminal a succession of voltage pulses the amplitude of which varies in stepwise fashion from a minimum value of 3 V to a maximum value of 8 V, with 300-mV step amplitude.

At the end of the erase pulse, a verification operation is carried out on all the memory cells of the sector to check the values of their threshold voltages, and this verification is performed by carrying out a margined reading which is able to guarantee correct recognition of the memory cell in the normal read mode.

In particular, the verification operation scans all the memory cells of the sector and is interrupted whenever a memory cell that does not pass the test is found. At this point, the next erase pulse is applied.

Consequently, the erase step proceeds with the application of an erase pulse followed by a verification step until all the memory cells have threshold voltages lower than a reference threshold voltage, which is the threshold voltage of the reference memory cells used during the verification operation.

Once the voltage pulses applied to the source and body terminals have reached their maximum amplitude, if the memory cells of the sector are not yet found to be all erased, then a second step of purely electrical erase is envisaged, during which both the gate terminals and the source and body terminals of the memory cells of the sector there are applied further erase pulses, up to a maximum of N pulses, in which the amplitude of the pulses applied to the source and body terminals of the memory cells is equal to the maximum amplitude envisaged.

Figure 2:
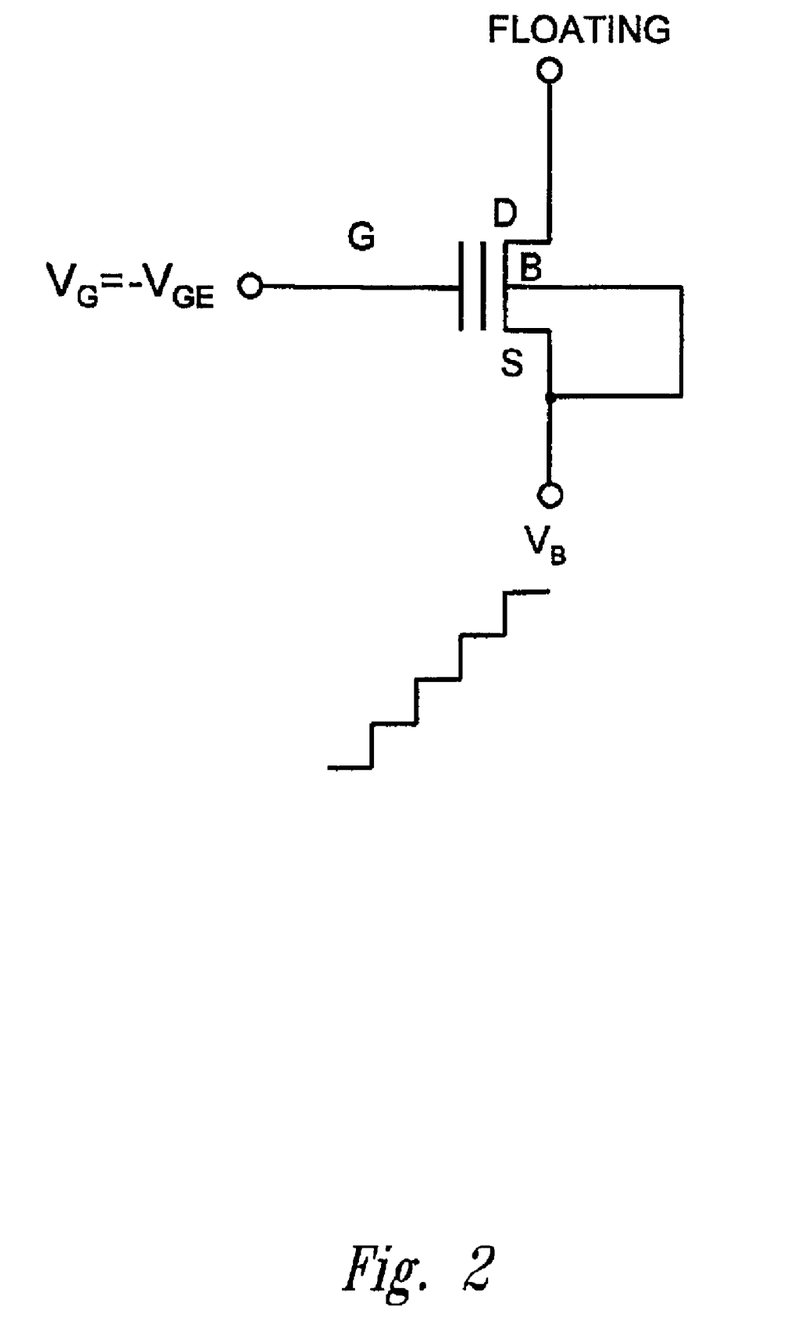
FIG. 2 shows the biasing of the gate, drain and source terminals of a memory cell during erase with negative gate.
Figure 3:
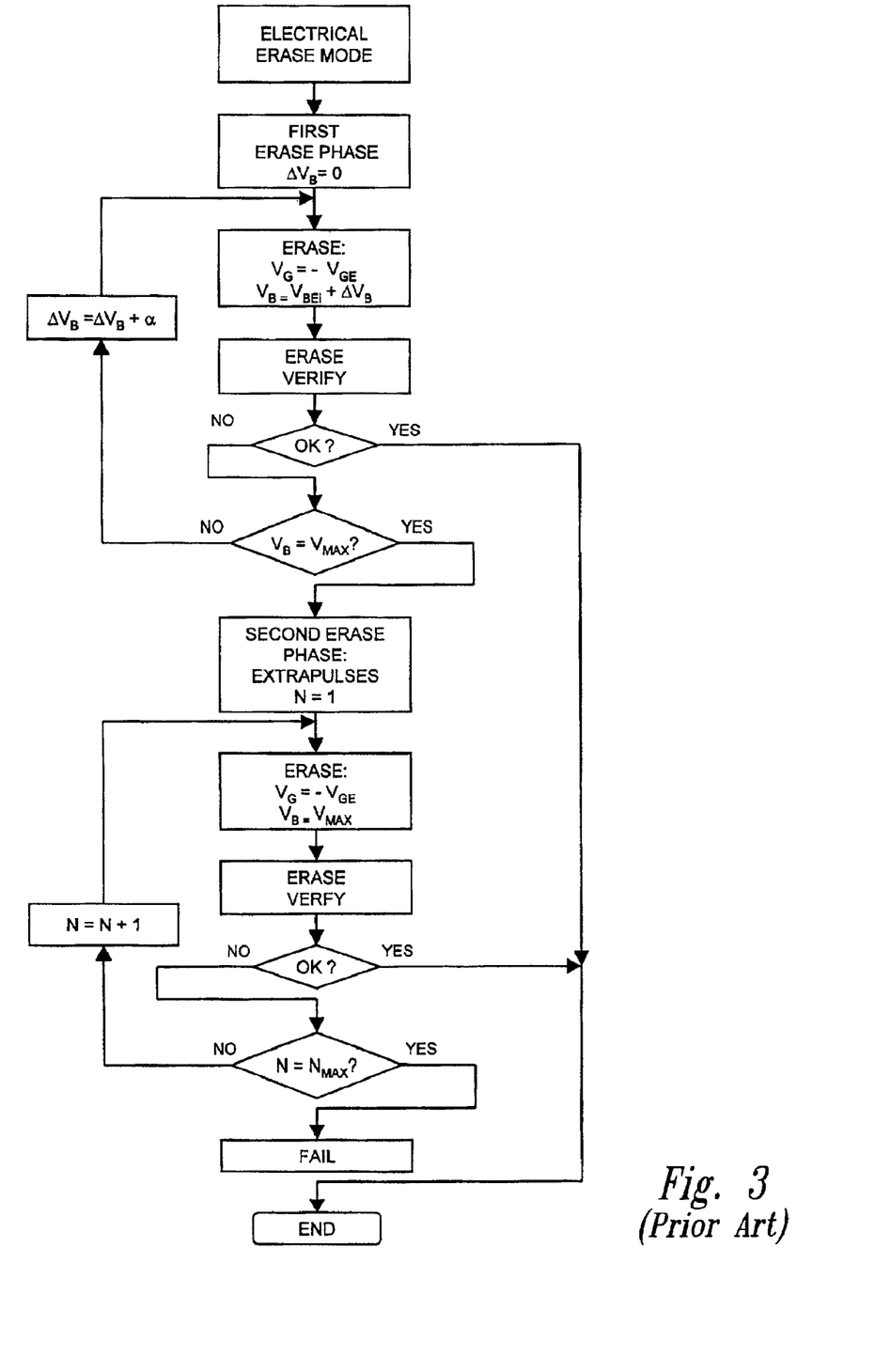
FIG. 3 is a flowchart of the erase algorithm with negative gate.

FIG. 2 represents the biasing of the gate terminal (G), drain terminal (D), source terminal (S), and body terminal (B) of a flash memory cell during erase with negative gate, in which $-V_{GE}$ designates the negative voltage pulse applied to the gate terminal, and $V_{BODY}$ designates the succession of voltage pulses, the amplitude of which varies in step-like fashion, which are applied to the source and body terminals, whilst FIG. 3 is a flowchart illustrating the operations implemented during erase with negative gate.

Figure 4:
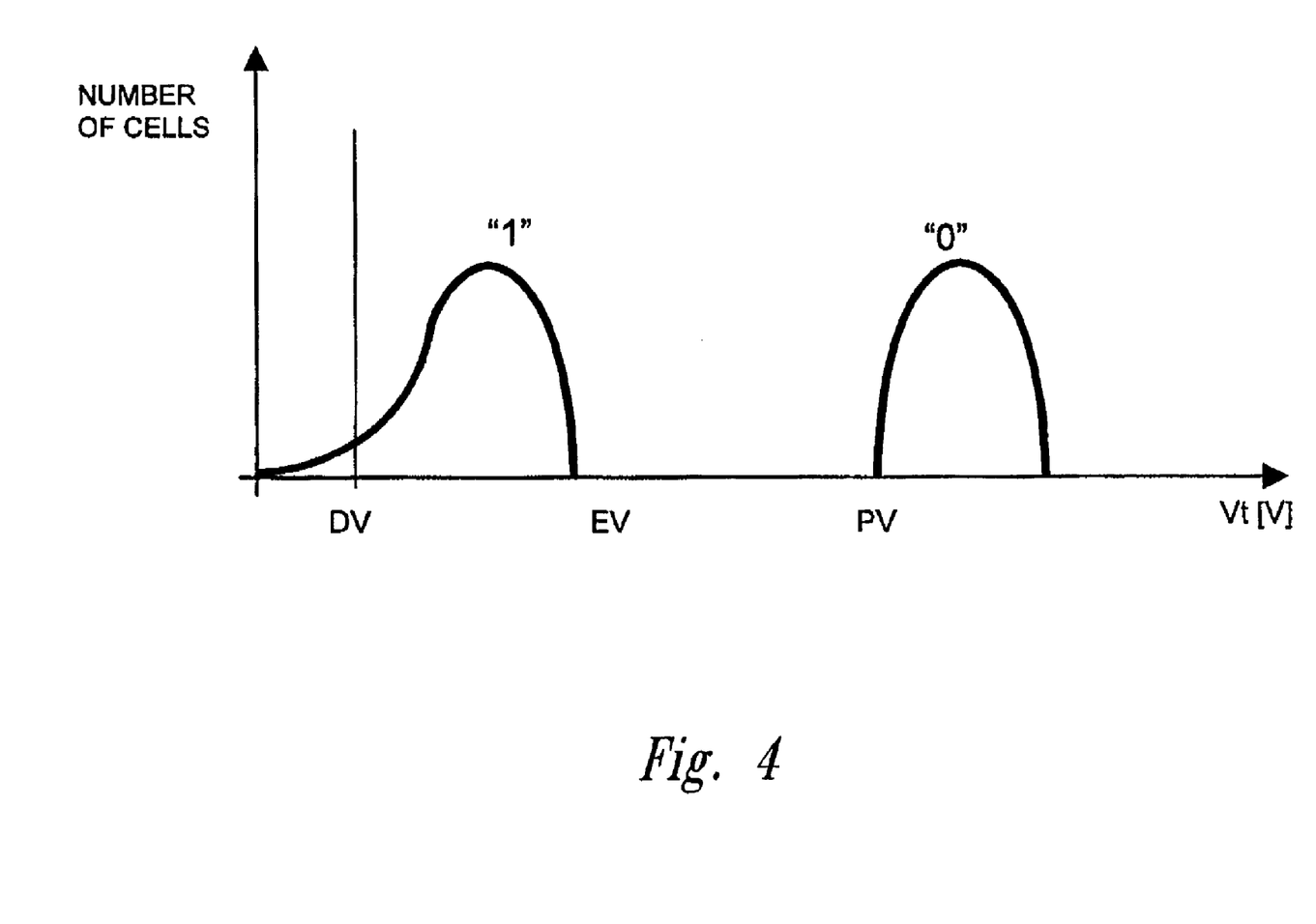
FIG. 4 shows the distributions of the threshold voltages of programmed and erased nonvolatile memory cells.

At the end of the purely electrical erase step, all the memory cells of the sector have threshold voltages with the distribution illustrated in FIG. 4 and identified with the binary information "1" associated thereto, namely, a distribution presenting a substantially Gaussian form to which a "tail" is superimposed that is due to the depleted memory cells. In FIG. 4, moreover, EV (Erase Verify) designates the threshold voltage used during the verification operations referred to above, typically 2.5 V, whilst DV (Depletion Verify) designates the threshold voltage below which the memory cells are considered depleted, typically in the region of 1 V (i.e., higher than ground voltage in order to ensure reliability).

Merely for reasons of comparison, FIG. 4 moreover shows the distribution of the threshold voltages of the programmed memory cells shown in FIG. 1.

The sector erase step cannot, however, be considered concluded yet because it is still necessary to make sure that there are no depleted memory cells present which might give rise to errors during the reading step. As has been said previously, in fact, since the said memory cells have a negative threshold voltage and hence drain a current even when their gate terminals are set at ground voltage, they are particularly troublesome in so far as they simulate the constant presence of erased memory cells on the columns to which they belong, and consequently cause all the memory cells belonging to the said columns to be read as erased irrespective of their actual state.

Consequently, the erase step proper is followed by a step of search for depleted memory cells, also known as "soft-program" step, in which the presence is verified of a leakage current on the columns of the memory array, by biasing all the rows of the array at ground voltage.

When a column presenting this anomaly is identified, then the first memory cell of the column is addressed, and a programming pulse having a pre-set amplitude is applied to its gate terminal in order to shift the threshold of the memory cell slightly without, however, exceeding the value EV referred to above. Next, the second memory cell of the same column is read. If no leakage current is present in the memory cell, this means that the depleted cell was the previous one, which has already been recovered; otherwise, the memory cell considered is programmed, and so forth up to the end of the column.

When the end of the column is reached, the verification operation is repeated and, in the case where a leakage current is still present, the procedure described above is repeated, increasing, however, the amplitude of the programming pulse applied to the gate terminal of the memory cells during programming.

In conclusion, it may be recalled that the time interval of one second, which is typically used by a commercially available EEPROM-FLASH memory for erasing a 1-Mbit sector, may be evenly divided between the three basic operations: preconditioning, electrical erase, and soft-programming.

In the light of what has been said previously, it should be clear how the operation of purely electrical erase does not terminate until all the memory cells have a threshold voltage lower than EV.

In order to understand the impact on the erase time of this procedure, it is necessary to follow the displacements of the distribution of the threshold voltages of the memory cells during the step of purely electrical erase.

In particular, after a few erase pulses, the distribution of the threshold voltage of the memory cells assumes its final form and from that moment on just translates rigidly at each subsequent pulse.

Figure 5:
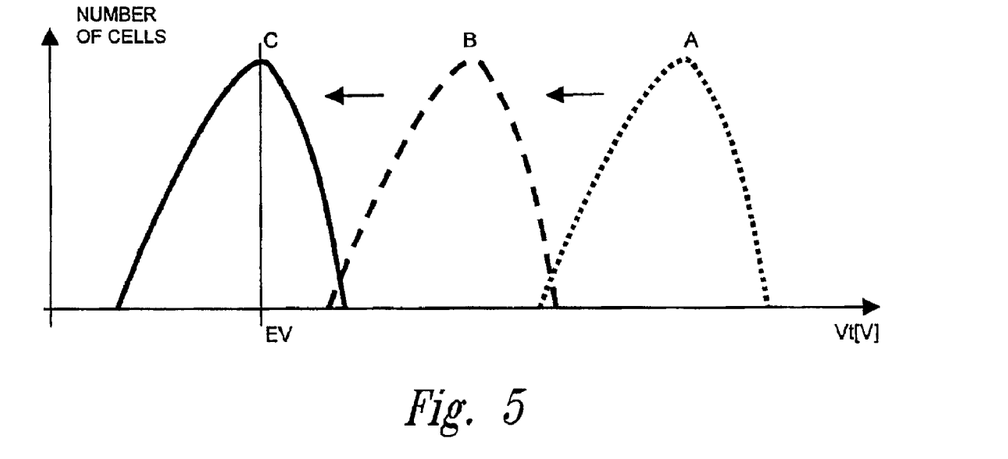
FIG. 5 shows the distributions of the threshold voltages of erased memory cells after different erase pulses.

By way of example, FIG. 5 illustrates the distributions of the threshold voltages of the erased memory cells after three erase pulses (curve A), after six erase pulses (curve B), and after nine erase pulses (curve C) in a given Flash process.

Figure 6:
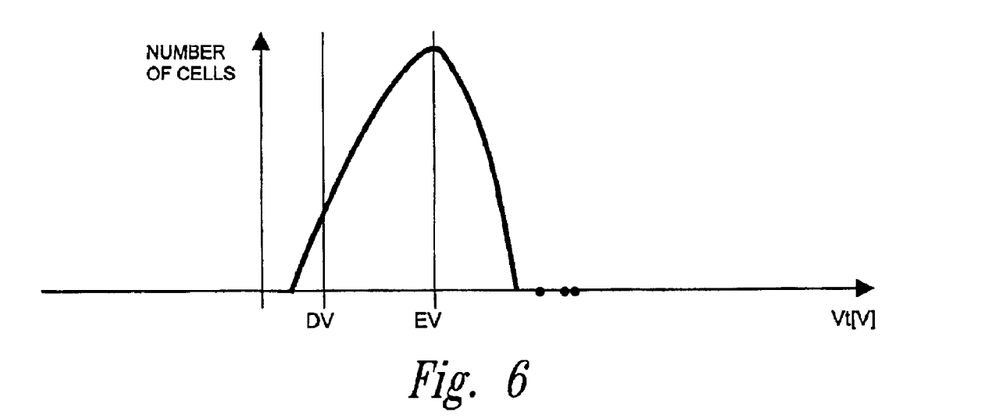
FIG. 6 shows the distributions of the threshold voltages of erased memory cells in the presence of memory cells that erase more slowly.

On account of the small geometrical differences between the various memory cells, in addition to the differences in the thickness of the oxides, amongst the memory cells erased there are some that are slower than others to erase; consequently, the actual distribution of the threshold voltages of the memory cells erased is of the type shown in FIG. 6, where, alongside the usual Gaussian, the presence may be noted of some isolated memory cells, indicated with dots, numbering three in the example illustrated.

Figure 7:
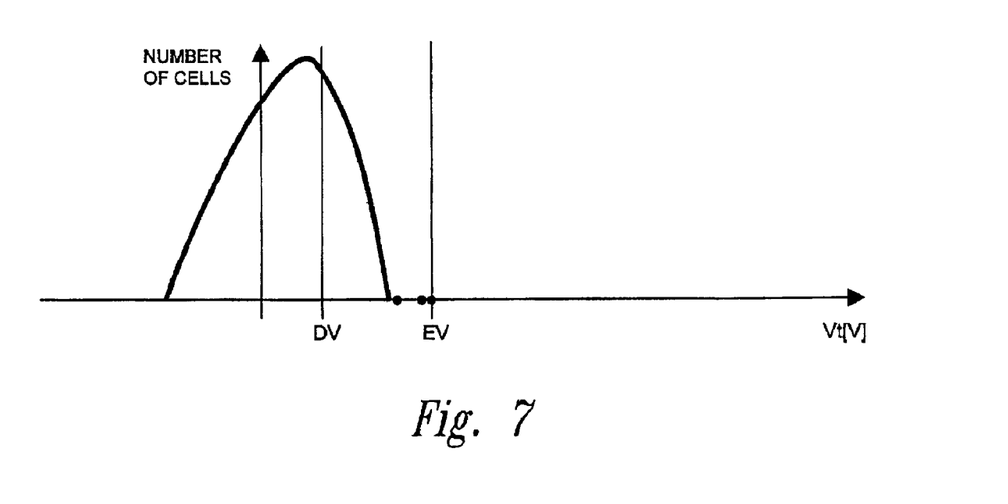
FIG. 7 shows the distributions of the threshold voltages of erased memory cells at the end of the step of purely electrical erase in the presence of memory cells that erase more slowly.

It may therefore be readily understood how, in the presence of memory cells that erase more slowly, erase with negative gate, and more generally erase performed with any other method, proceeds with the application of erase pulses until also the last memory cell has a threshold voltage lower than EV, thus giving rise to a distribution of the threshold voltages of the erased memory cells of the type shown in FIG. 7.

In particular, on account of the memory cells that erase more slowly, the distribution of the threshold voltages of the memory cells continues to shift towards increasingly lower values, thus causing an increase in the number of memory cells to which a programming pulse will have to be applied during the soft-programming step, with evident negative effects on the time required for erasing the sector.

BRIEF SUMMARY OF THE INVENTION

An embodiment of the present invention provides a method for erasing an EEPROM-FLASH nonvolatile memory that enables erase times to be achieved that are shorter than those of known EEPROM-FLASH nonvolatile memories.

A further embodiment of the present invention provides an EEPROM-FLASH nonvolatile memory that enables erase times to be achieved that are shorter than those of known EEPROM-FLASH nonvolatile memories.

According to an embodiment of the present invention, a method for erasing an electrically erasable nonvolatile memory device, in particular an EEPROM-FLASH memory device having a memory array formed by a plurality of memory cells grouped in sectors each formed by a plurality of subsectors is provided. The erasing method comprises the steps of erasing a sector of the memory array, and of verifying erase of the sector; wherein the step of verifying erase of the sector comprises the step of verifying erase of each subsector of the sector; and further comprises the step of erasing only the subsectors not completely erased within the sector.

Moreover according to an embodiment of the present invention, an electrically erasable memory device, in particular an EEPROM-FLASH memory device, is provided. The memory device includes a memory array formed by a plurality of memory cells grouped in sectors each formed by a plurality of subsectors, and a first erasing means for erasing a sector of the memory array, and a first verifying means for verifying erase of the sector; with the first verifying means comprising a second verifying means for verifying erase of each subsector of the sector; and further comprising a second erasing means for further erasing the subsectors not completely erased within the sector.

BRIEF DESCRIPTION OF THE SEVERAL VIEWS OF THE DRAWING(S)

For a better understanding of the present invention, two preferred embodiments thereof are now described, purely to provide non-limiting examples, with reference to the attached drawings, in which.

DETAILED DESCRIPTION OF THE INVENTION

An embodiment of the present invention reduces the erase time of the memory device by implementing an erase process that is able to reduce the number of cells that are found to be depleted at the end of the step of purely electrical erase.

The embodiment takes as its starting point U.S. Pat. No. 6,122,200, which is incorporated herein by reference in its entirety, where a nonvolatile memory device is described in which each sector is divided into subsectors obtained in the direction of the rows, each being formed by one or more rows, and in which the row decoding stage has a circuit structure that enables erase of one subsector independently of the others subsectors.

Figure 8:
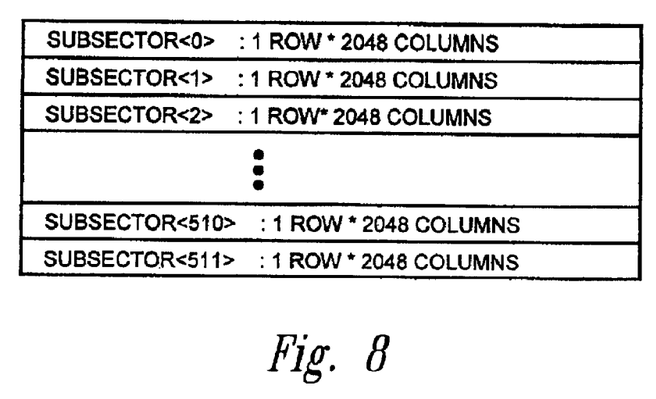
FIG. 8 shows the division of a sector of the memory array into subsectors.

By way of example, FIG. 8 is a schematic representation of a 1-Mbit sector formed by 512 rows and 2048 columns and divided into 512 subsectors, each being formed by a single row.

In the nonvolatile memory device proposed in the above-mentioned European patent application, when the aim is to erase an entire sector, it is possible to proceed in two different ways: either the entire sector may be erased in the way described previously, or one subsector after another may be erased sequentially.

In the case where the subsectors are erased sequentially, one after another, each subsector presents a distribution of its own of the threshold voltages of the erased memory cells, whereas the distribution of the threshold voltages of the erased memory cells in the entire sector is nothing but the convolution of the distributions of the erased memory cells of the subsectors forming it.

The big advantage deriving therefrom is that the "dragging" effect of the cells that erase more slowly is no longer extended to all the memory cells of the sector, but is "confined" within the subsector or subsectors to which said memory cells belong, and in this way the number of memory cells that are to undergo soft-programming is drastically reduced.

Figure 9:
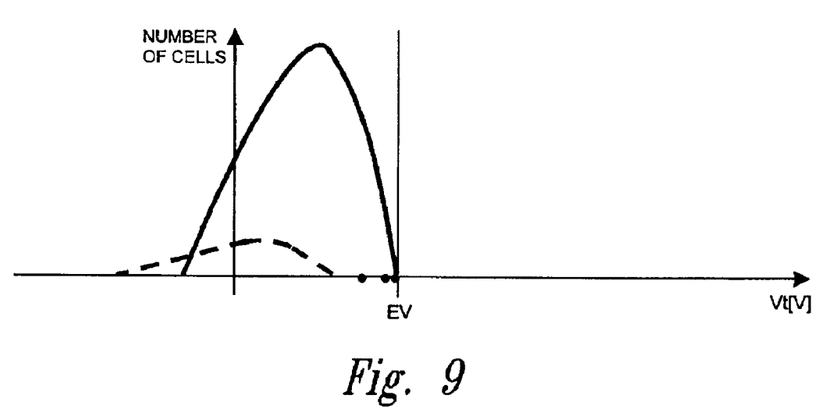
FIG. 9 shows the distribution of the threshold voltages of erased memory cells at the end of the purely electrical erase according to subsectors in the presence of memory cells that erase more slowly.

The confinement of the "dragging" effect of the memory cells that erase more slowly is highlighted in FIG. 9.

In particular, with reference briefly again to the situation illustrated in FIG. 6, in the nonvolatile memory device proposed in the aforementioned European patent application, the three memory cells that erase more slowly affect only the distributions of the threshold voltages of the erased memory cells of the subsectors to which they belong, leaving unaltered the distributions of the threshold voltages of the erased memory cells of the other subsectors. Consequently, at the end of the step of purely electrical erase, the situation will be the one illustrated in FIG. 9, in which the dashed curve refers to the distribution of the threshold voltages of the erased memory cells belonging to the subsectors containing the memory cells that erase more slowly, whilst the solid curve refers to the distribution of the threshold voltages of the erased memory cells of the entire sector.

However, although erase of a sector by subsectors enables, on the one hand, confinement of the dragging effect of the memory cells that erase more slowly within the subsector or subsectors to which the said memory cells belong, thus considerably reducing the number of memory cells to be subjected to soft-programming, on the other hand it determines a considerable increase in the overall time for erasing the sector. In fact, since the subsectors must be erased one after another sequentially, the overall erase time for the sector increases proportionally to the number of subsectors into which the sector is divided. Consequently, the need to divide the sector into a particularly high number of subsectors may give rise to erase times that, in certain applications, may prove unacceptable.

Consequently, given that in the nonvolatile memory device proposed in the aforementioned European patent application, the dragging effect occurs only in the subsectors containing the memory cells that erase more slowly. An embodiment of the present invention essentially envisages modifying the erase algorithm, according to the prior art illustrated in FIG. 3 and described previously, which envisages the application of a subsequent erase pulse to all the memory cells of the sector as soon as a non-erased memory cell is identified in the verification step, simply by identifying, after each erase pulse, which subsectors are completely erased, and then applying the subsequent erase pulse to those subsectors that are not completely erased.

In this way, even though the time for the purely electrical erase remains the same as that of the prior art, in so far as it is determined by the memory cells that erase more slowly, the erase by subsectors according to the present invention makes it possible to achieve a time saving linked to the smaller number of memory cells that are to undergo the soft-programming step.

The implementation of the erase method according to an embodiment of the present invention involves both modification of the architecture of the row decoder and modification of the erase algorithm shown in FIG. 3 and described previously.

In particular, the row decoder is able to address each subsector independently of the other subsectors, and hence is able to address a number of rows of the memory array simultaneously.

Consequently, row decoding can no longer be performed by a mere binary decoder, i.e., a decoder that has only one active output at a time. In fact, where the embodiment provides a means to erase a number of subsectors simultaneously, it is necessary to render all the rows belonging thereto active simultaneously.

Clearly, the foregoing applies exclusively to the erase step, in so far as the complete implementation of row decoding must take into account also the reading and programming steps, for which a binary decoder operation is again needed, i.e., a binary decoder that presents only one active output at a time.

Figure 10:
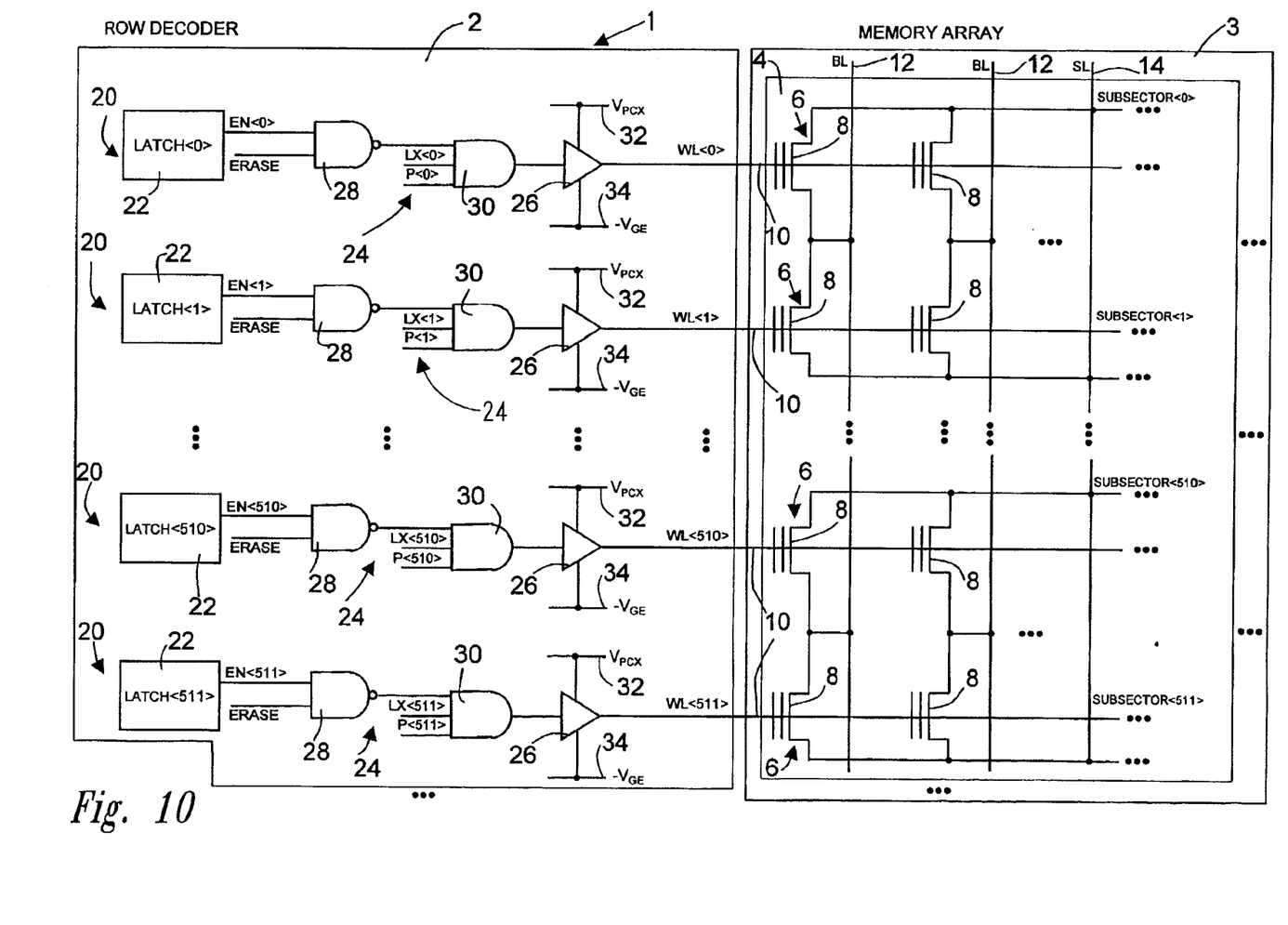
FIG. 10 is a schematic representation of a row decoding stage that enables implementation of electrical erase by subsectors according to a first embodiment of the present invention.

The resulting row decoder structure may be of the type represented in FIG. 10, in which only the part of the row decoder used for addressing the sector shown in FIG. 8 is represented by way of example.

In particular, in FIG. 10, the reference number 1 designates the nonvolatile memory device 10 as a whole, the reference number 2 designates the row decoder, 3 designates the memory array, 4 designates the sector of the memory array 3, 6 designates the subsectors of the sector 4, 8 designates the memory cells of the sector 4, 10 designates the word lines of the sector 4, 12 designates the bit lines of the sector 4, and 14 designates the common line to which the source terminals of the memory cells 8 of the sector 4 are connected.

According to what is illustrated in FIG. 10, each subsector 6 is addressed by means of a corresponding address stage 20 comprising a latch 22, a selection device 24, and a driver 26, which are cascaded together.

In particular, in the latch 22 there is stored a flag the logic value of which indicates the result of the operation of verification of the corresponding subsector 6. In detail, the flag stored in each latch 22 assumes a first logic value, for example the logic value "0", if the corresponding subsector 6 has been verified as completely erased, and a second logic value, in the example considered the logic value "1", if the corresponding subsector has been verified as not being completely erased.

The latch 22 moreover has an output on which it supplies a respective enabling signal EN<i>, where i=1 . . . n is the index of the corresponding subsector 6, which assumes a high logic level corresponding to the logic level of the flag stored therein; namely, it assumes a high logic level if the flag assumes the logic value "1", and a low logic level if the flag assumes the logic value "0".

The selection device 24 is basically formed by a NAND logic gate 28 and an AND logic gate 30 cascaded together.

In particular, the NAND logic gate 28 has a first input connected to the output of the corresponding latch 22 and receiving the enabling signal EN<i> supplied by the latter, a second input receiving a logic erase signal ERASE, which assumes a high logic level during the erase step and a low logic level otherwise, and an output connected to a first input of the AND logic gate 30.

The AND logic gate 30 moreover has a second input and a third input receiving respective pre-decoding signals P<i> and LX<i> generated, in a known way not described in detail, by a binary pre-decoding stage (not illustrated) as a function of the address signals supplied at its input, and an output connected to an input of the driver 26, the output of which is connected to the word line 10 of the corresponding subsector 6.

In addition, the driver 26 has a first supply input and a second supply input respectively connected to a first biasing line 32 and a second biasing line 34, which are respectively set at a positive supply voltage $V_{PCX}$ and a negative erase voltage $-V_{GE}$ of a value equal to the one that must be supplied to the gate terminals of the memory cells 8 to be erased, and has a circuit structure of the type described, for instance, in U.S. Pat. No. 6,356,481, which is incorporated herein by reference in its entirety.

During use, in the erase step for erasing a subsector 6, both the erase signal ERASE and the pre-coding signals P<i> and LX<i> assume a high logic level.

In this way, the AND logic gate 30 operates as a simple non-inverting buffer, and the output of the corresponding driver 26 assumes a logic level that depends upon the logic level assumed by the enabling signal EN<i> supplied by the corresponding latch 22, i.e., upon the logic value of the flag stored in the latch 22 itself. In particular, erase of the subsector 6 is performed only if the corresponding enabling signal EN<i> assumes a high logic value, in so far as it is only in this condition that the output of the driver 26 assumes a low logic level defined by the negative voltage $-V_{GE}$, and hence the word line 10 of the subsector 6 is biased at the negative erase voltage $-V_{GE}$.

In the latch 22 of each addressing stage 20 the flag representing the result of the verification of the erase of the corresponding subsector 6 is then updated. In particular, if the subsector 6 is verified as being completely erased, the flag stored in the corresponding latch 22 is set at a logic value "0" and remains at this value throughout the erase step; otherwise, the flag continues to assume the logic value "1" set at the start of the erase step.

In the steps of reading and programming of a subsector 6, instead, the erase signal ERASE assumes a low logic level, in such a way that the output of the NAND logic gate 28 will assume a high logic level and consequently will have no effect on the AND logic gate 30, the output of which assumes a logic value that depends exclusively on the pre-coding signals P<i> and LX<i>, as normally occurs for reading and programming, where it must be possible to bias only one row at a time. In particular, the output of the AND logic gate 30 assumes a high logic value, and hence the corresponding row is found to be addressed, only when both of the pre-decoding signals P<i> and LX<i> assume a high logic level simultaneously.

Figure 11:
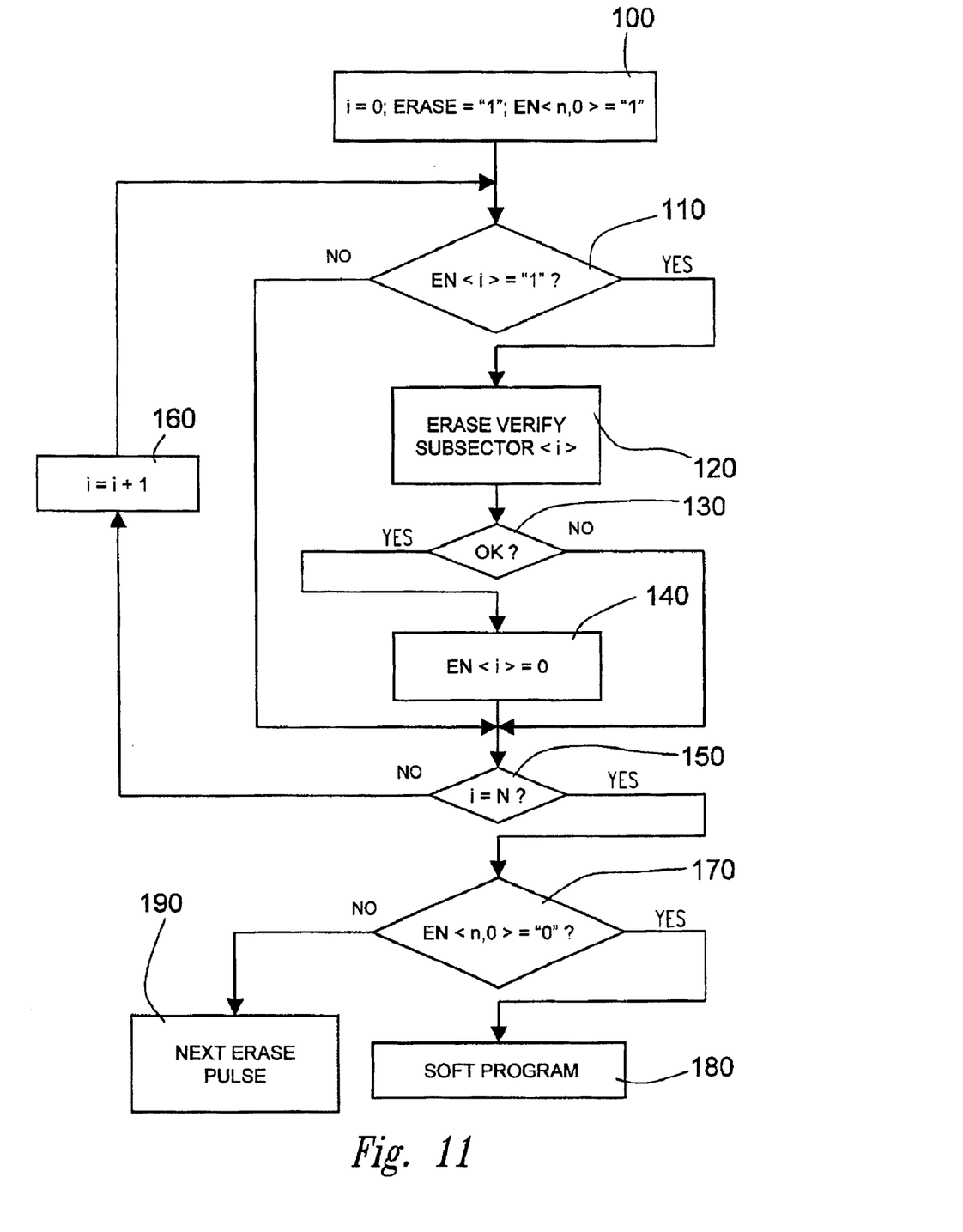
FIG. 11 is a flowchart of the operations for verification of the erase by subsectors in accordance with the present invention.

As has been said previously, the implementation of the method for erasing a sector according to an embodiment of the present invention also requires modification of the erase algorithm shown in FIG. 3 and previously described, and more in particular requires that the verification of erase of the subsector following upon an erase pulse be carried out in the way illustrated in FIG. 11.

In particular, after an erase pulse has been applied implementing the operations illustrated in FIG. 3 and previously described, an initial step, as shown in FIG. 11, is carried out in which the erase signal ERASE is set at the high logic level, and the flags stored in all the latches 22 are set at the logic value "1", thus causing all the enable signals EN<i> to assume a high logic level (block 100).

At this point, there are identified all the subsectors 6 that are completely erased and the subsectors 6 that are not yet completely erased, and the contents of the latches 22 are updated accordingly (blocks 110–160).

In particular, in order to do this, the subsectors 6 are examined one at a time in succession, and for each subsector 6 it is verified whether the corresponding enabling signal EN<i> assumes the high logic level (block 110). If the enabling signal EN<i> assumes the high logic level (output YES from block 110), then verification of erase of the subsector 6 is carried out (block 120) and the result thereof is evaluated (block 130). If the verification yields a positive result (output YES from block 130), the contents of the latch 22 associated to the subsector 6 that has been examined is updated by setting the flag stored therein at the logic value "0", thus causing the corresponding enabling signal EN<i> to assume a low logic level (block 140).

Once the contents of the latch 22 have been updated, or if the verification of the erase of the subsector 6 has yielded a negative result (output NO from block 130), or yet again if the enabling signal EN<i> of the subsector 6 assumes a low logic level (output NO from block 110), then a verification is carried out to see whether all the subsectors 6 have been examined (block 150).

If not all the subsectors 6 have yet been examined (output NO from block 150), then a subsequent subsector 6 is considered (block 160), and the operations are resumed from the ones described with reference to block 110. If, instead, all the subsectors 6 have been examined (output YES from block 150), then a verification is carried out to see whether the subsectors 6 have all been completely erased, i.e., whether all the enabling signals EN<i> of the subsectors 6 assume the low logic level (block 170).

If all the enabling signals EN<i> of the subsectors 6 assume the low logic level (output YES from block 170) the soft-programming step is carried out in the way initially described (block 180). If, instead, at least one of the enabling signals EN<i> of the subsectors 6 assumes the high logic level (output NO from block 170), then a further erase pulse is applied (block 190), performing the operations shown in FIG. 3 and previously described.

In particular, thanks to the structure of the row decoder 1 shown in FIG. 10 and to the contents of the latches 22 (and hence to the logic level assumed by the enabling signals EN<i>), the further erase pulse is applied only to the memory cells 8 belonging to the subsectors 6 that are found not to be completely erased.

As far as the erase step is concerned, a further clarification is here necessary regarding the way in which the erase verification must be performed. In fact, the presence of a depleted memory cell during the verification following the erase pulse may simulate the presence of a completely erased column, when, instead, there are still present memory cells having threshold voltages higher than the aforementioned value EV. The verification must, therefore, be carried out with the deselected rows biased at a negative voltage such as to turn off any depleted memory cells, in so far as only in this case is it possible to deem the result of the verification significant. The flag stored in each latch must, in fact, assume a low logic value only when all the memory cells belonging to the corresponding row are found to have a threshold voltage lower than EV.

In order to carry out erase verification with deselected rows biased at a negative voltage, reference may be made to the U.S. Pat. 6,356,481 in which a driver is presented, which has a circuit structure that makes possible biasing of the deselected rows at a negative voltage.

Finally, it is clear that numerous modifications and variations may be made to the erase method and to the EEPROM- FLASH nonvolatile memory device described and illustrated herein without thereby departing from the protection scope of the present invention, as defined in the attached claims.

Figure 12:
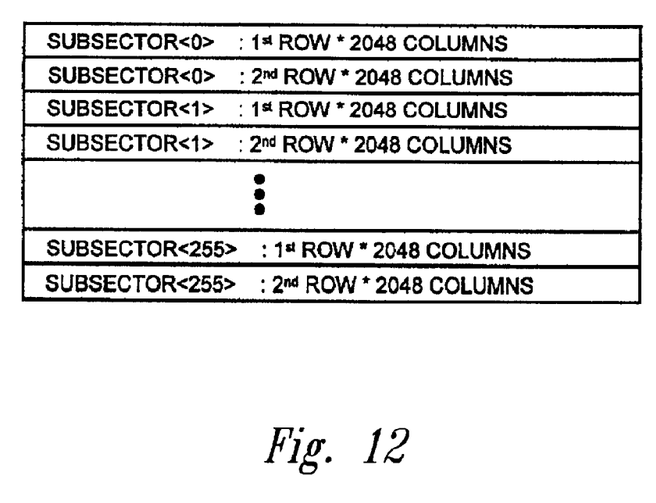
FIG. 12 shows the division of a sector of the memory array into subsectors according to a second preferred embodiment of the present invention.

For example, as has been said previously, each subsector could be formed by a plurality of rows. FIG. 12 is a schematic representation of a 1-Mbit sector formed by 512 rows and 2048 columns, and divided into 256 subsectors, each of which is formed by two rows, whilst FIG. 13 is a schematic representation of the circuit structure of a row decoder that enables independent addressing of the subsectors of FIG. 12.

Figure 13:
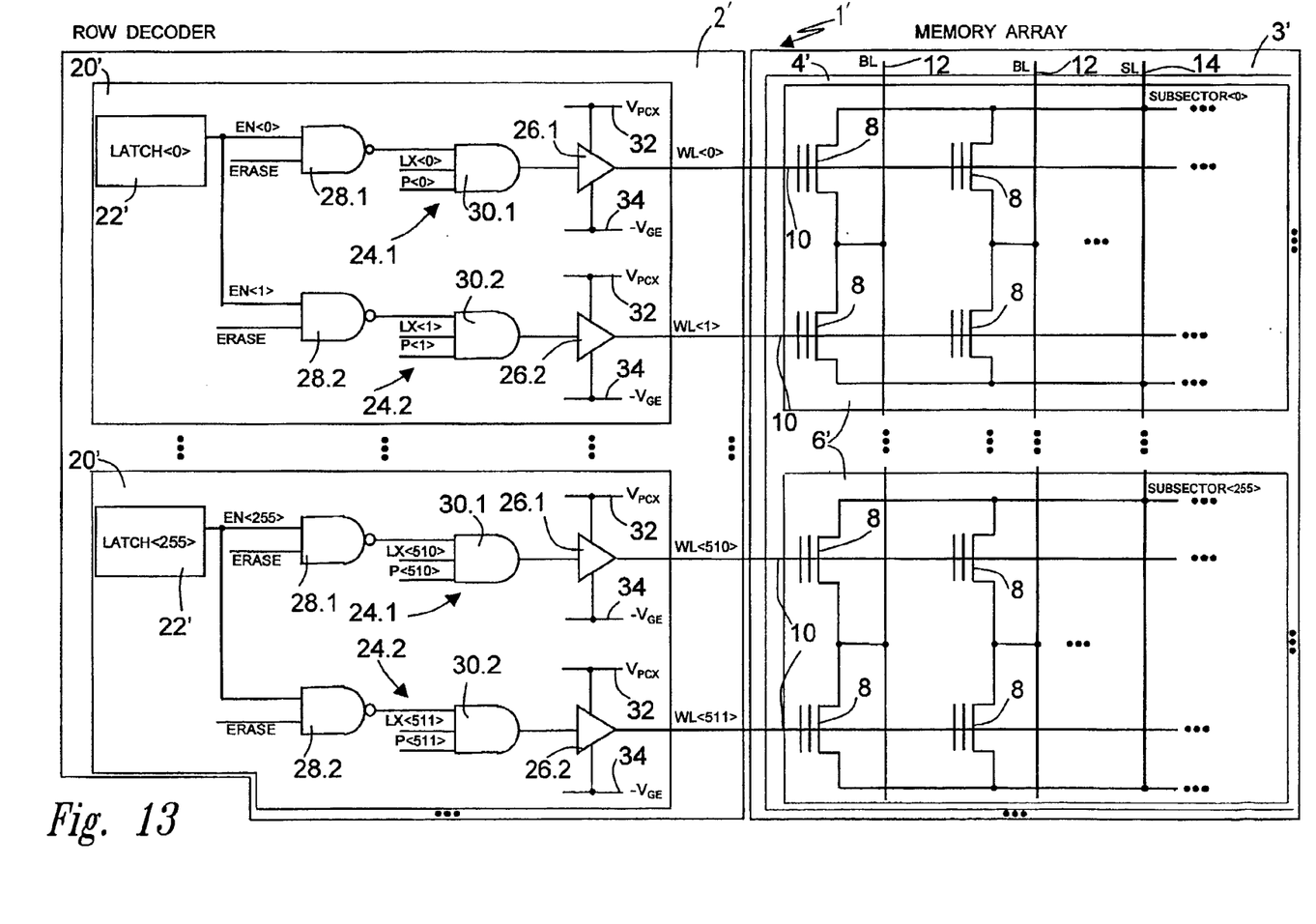
FIG. 13 is a schematic representation of a row decoding stage that enables implementation of the electrical erase by subsectors according to the second embodiment of the present invention.

In FIG. 13, the nonvolatile memory device is designated, as a whole, by 1', the row decoder is designated by 2', the memory array is designated by 3', the sector of the memory array 3' is designated by 4', and the subsectors of the sector 4' are designated by 6'.

In particular, as may be noted in FIG. 13, each subsector 6' is addressed by means of a corresponding addressing stage 20' comprising a single latch 22' and, for each row of the subsector 6', a selection device, designated respectively by 24.1 and 24.2, and a driver, designated respectively by 26.1 and 26.2, which are cascaded together.

Both the selection devices 24.1, 24.2 are each formed by a NAND logic gate, respectively designated by 28.1 and 28.2, and an AND logic gate, respectively designated by 30.1 and 30.2, which are cascaded together, in which the NAND logic gate 28.1, 28.2 has a first input connected to the output of the latch 22' and receiving the corresponding enabling signal EN<i>, a second input receiving the erase signal ERASE, and an output connected to a first input of the AND logic gate 30.1, 30.2, which has a second input and a third input receiving respective pre-decoding signals P<i>, LX<i>, and an output connected, via the respective driver 26.1, 26.2, to the respective word line 10.

The various embodiments described above can be combined to provide further embodiments. All of the above U.S. patents, patent applications and publications referred to in this specification are incorporated by reference. Aspects of the invention can be modified, if necessary, to employ systems, circuits and concepts of the various patents, applications and publications to provide yet further embodiments of the invention.

What is claimed is:

1. A method for erasing an electrically erasable nonvolatile memory device, in particular an EEPROM-FLASH memory device, the nonvolatile memory device including a memory array formed by a plurality of memory cells grouped in sectors each formed by a plurality of subsectors having a plurality of word lines, the erase method comprising the steps of:

erasing a sector of the memory array by extracting electrons from floating gates of memory cells;

verifying erase of said sector wherein said step of verifying erase of said sector comprises the step of verifying erase of each subsector of said sector, which includes verifying erase of at least one subsector of said sector, wherein said verifying erase of at least one subsector of said sector includes verifying erase of a selected subset of memory cells within that subsector with a deselected subset of the memory cells within that subsector biased at a negative voltage; and further erasing only the subsectors not completely erased of said sector, including allowing erasure of multiple word lines in a same subsector simultaneously.

2. The erase method according to claim 1, wherein said step of erasing a sector of the memory array comprises the step of supplying an erase pulse to the memory cells of said sector; and said step of further erasing only the subsectors not completely erased of said sector comprises the step of supplying a further erase pulse to the memory cells of said subsectors.

3. The erase method according to claim 1, wherein said step of verifying erase of each subsector of said sector comprises the step of verifying whether the memory cells of each said subsector have a threshold voltage lower than a reference value.

4. The erase method according to claim 1, said further comprising the step of repeating said steps of verifying erase of each subsector of said sector, and erasing the subsectors not completely erased of said sector until said sector is completely erased.

5. An electrically erasable nonvolatile memory device, in particular an EEPROM-FLASH memory device, the nonvolatile memory device comprising:

a memory array formed by a plurality of memory cells grouped in sectors each formed by a plurality of subsectors having a plurality of word lines;

first erasing means for erasing a sector of the memory array;

first verifying means for verifying erase of said sector; wherein said first verifying means comprise second verifying means for verifying erase of each subsector of said sector, including means for verifying erase of a selected subset of memory cells within that subsector with a deselected subset of the memory cells within that subsector biased at a negative voltage; and second erasing means for further erasing the subsectors not completely erased of said sector, including means for allowing erasure of multiple word lines in a same subsector simultaneously.

6. The nonvolatile memory device according to claim 5, wherein said first and second erasing means comprise an erase pulse generating means supplying erase pulses to said memory cells.

7. The nonvolatile memory device according to claim 5, wherein said second verifying means verify whether the memory cells of each subsector have a threshold voltage lower than a reference value.

8. The nonvolatile memory device according to any of claims 5, wherein said second verifying means comprise activation means activating repeatedly said second verifying means and said second erasing means until said sector is completely erased.

9. The nonvolatile memory device according to claim 5, further comprising row decoding means addressing each subsector independently of the other subsectors; said row decoding means including, for each subsector, addressing means comprising storage means for storing a flag having a logic value indicating the result of an operation of verifying erase of the subsector and having an output supplying an enabling signal assuming a first and a second logic level corresponding to the logic value of said flag.

10. The nonvolatile memory device according to claim 9, wherein said memory cells are arranged in rows and columns and said memory array comprises word lines connecting control terminals of the memory cells arranged in the same row, and bit lines connecting first terminals of the memory cells arranged in the same column, the memory cells belonging to the same sector further having second terminals connected together, each subsector being further formed by memory cells belonging to one or more rows, wherein the addressing means associated to each subsector further comprise, for each row of the subsector, a selection means having a first input connected to the output of said storage means and receiving said enabling signal, a second input receiving a logic erase signal assuming a first logic level during erasing of the sector, and an output connected to the word line of the respective row, and supplying a biasing signal which is a function of said enabling signal and of said erase signal.

11. The nonvolatile memory device according to claim 10, wherein said selection means comprise logic gate means.

12. The nonvolatile memory device according to claim 10, wherein the addressing means associated to each subsector further comprise, for each row of the subsector, driving means having a first input connected to the output of said selection means and an output connected to the word line of the respective row.

13. The nonvolatile memory device according to claim 12, wherein said driving means have a first biasing input and a biasing second input connected, respectively, to a first line set at a positive supply potential and to a second line set at a negative erase potential.

14. A method of erasing a nonvolatile memory device, the method comprising:

preconditioning a memory array wherein a plurality of memory cells are programmed to a first threshold voltage;

erasing the memory array wherein a plurality of memory cells are programmed to a second threshold voltage; and verifying a sector of the memory array wherein a first subsector is verified and subsequently a second subsector is verified such that only subsectors having a nonerased cell are subject to a further erasing and verifying, and further allowing the further erasing for a plurality of nonerased cells on different word lines in a same subsector, the subsector including a plurality of word lines, wherein verifying the sector includes verifying erase of at least one subsector of said sector, wherein said verifying erase of at least one subsector of said sector includes verifying erase of a selected subset of memory cells within that subsector with a deselected subset of the memory cells within that subsector biased at a negative voltage.

15. The method of erasing a nonvolatile memory device according to claim 14, having a memory array decoded into a plurality of sectors wherein the plurality of sectors is further decoded into subsectors, and wherein erasing further comprises:

setting a sector index to a value where the value indicates a first sector, an erase enable flag to a first value where the first value indicates a nonerased sector, and an erase signal to a first value where the first value indicates erase is to be performed; and testing the erase enable flag to determine if the sector is a nonerased sector.

16. The method of erasing a nonvolatile memory device according to claim 15 wherein testing further comprises:

upon a condition of the erase enable flag indicating a nonerased sector, then performing the erasing and verifying on the nonerased sector;

alternatively, upon a condition of the erase enable flag indicating an erased sector, then testing the sector index for a final sector; and testing a result of the erasing and verifying of the nonerased sector.

17. The method of erasing a nonvolatile memory device according to claim 15 wherein testing further comprises:

upon a condition of a result of the erasing and verifying being an erased sector, then setting the erase enable flag to a second value wherein the second value indicates that the sector is erased;

alternatively, upon a condition of the result of the erasing and verifying being a nonerased sector, then maintaining the erase enable flag at the first value to indicate a nonerased sector; and testing the sector index for a final sector.

18. The method of erasing a nonvolatile memory device according to claim 15 wherein testing further comprises:

upon a condition of the sector index indicating the final sector, then testing the erase enable flag;

alternatively, upon a condition of the sector index indicating a nonfinal sector, then incrementing the sector index value to indicate a next sector;

upon a condition of the erase enable flag indicating an erased sector, then performing soft-programming; and alternatively upon a condition of the erase enable flag indicating a nonerased sector then performing application of a next erase pulse.

19. An electrically erasable nonvolatile memory device, comprising:

a memory array having a plurality of memory cells and a plurality of word lines, wherein the memory cells are grouped in a sector having a plurality of subsectors each having a plurality of word lines;

an erase status storage device having an output terminal;

an erase enable device having output and input terminals, the input terminal coupled to the output terminal of the erase status storage device;

a biasing device coupled between first and second supplies and having an output terminal and an input terminal, the input terminal being coupled to the output terminal of the erase enable device, and the output terminal being coupled to a word line of the plurality of word lines of the memory array, wherein the first and second supplies bias the word line of a subsector of the plurality of subsectors, and wherein multiple word lines in a same subsector may be erased simultaneously; and a first verifying device to verify erase of said sector, wherein said first verifying device includes a second verifying device to verify erase each subsector of said sector, including verifying erase of a selected subset of memory cells within that subsector with a deselected subset of the memory cells within that subsector biased at a negative voltage.

20. The memory device according to claim 19 wherein the erase status storage device further comprises a memory cell, wherein a state of the memory cell determines an erase status of the subsector of the plurality of subsectors.

21. The memory device according to claim 19 wherein the erase enable device further comprises a selection device to select either an erase enable signal or first and second pre-decoding signals, wherein the selection device is controlled by a stored value of the erase status storage device.

22. The memory device according to claim 21 wherein if the stored value of the erase status storage device is logical one, then the erase enable signal is selected, and alternatively if the stored value of the erase status storage device is logical zero, then the first and second pre-decoding signals are selected.

23. A method for erasing an electrically erasable nonvolatile memory device, in particular an EEPROM-FLASH memory device, the nonvolatile memory device including a memory array formed by a plurality of memory cells grouped in sectors, each sector formed by a plurality of subsectors each having at least one word line having one or more memory cells, the method comprising:

erasing a sector of the memory array by extracting electrons from floating gates of memory cells;

verifying erase of said sector, which includes verifying erase of at least one subsector of said sector, wherein said verifying erase of at least one subsector of said sector includes verifying erase of a selected subset of memory cells within that subsector with a deselected subset of the memory cells within that subsector biased at a negative voltage; and further erasing only the subsectors not completely erased of said sector, including allowing both erasure of multiple word lines simultaneously and a single word line.

24. The erase method according to claim 23 wherein said erasing a sector of the memory array comprises supplying an erase pulse to the memory cells of said sector, and wherein said further erasing only the subsectors not completely erased of said sector comprises supplying a further erase pulse to the memory cells of said subsectors.

25. The erase method according to claim 23, further comprising repeating said verifying erase of each subsector of said sector, and erasing the subsectors not completely erased of said sector until said sector is completely erased.

* * * * *